(12) United States Patent
Hsu et al.

(10) Patent No.: US 10,529,825 B2
(45) Date of Patent: Jan. 7, 2020

(54) SEMICONDUCTOR DEVICE AND MANUFACTURING METHOD THEREOF

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Chun-Ya Chiu, Tainan (TW); Chin-Hung Chen, Tainan (TW); Chi-Ting Wu, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/951,147

(22) Filed: Apr. 11, 2018

(65) Prior Publication Data
US 2019/0296124 A1 Sep. 26, 2019

(30) Foreign Application Priority Data

Mar. 21, 2018 (CN) .......................... 2018 1 0235339

(51) Int. Cl.
| | |
|---|---|
| *H01L 29/66* | (2006.01) |
| *H01L 21/28* | (2006.01) |
| *H01L 21/311* | (2006.01) |
| *H01L 27/088* | (2006.01) |
| *H01L 21/8234* | (2006.01) |

(52) U.S. Cl.
CPC .... *H01L 29/6656* (2013.01); *H01L 21/28132* (2013.01); *H01L 21/31105* (2013.01); *H01L 21/823418* (2013.01); *H01L 21/823468* (2013.01); *H01L 21/823475* (2013.01); *H01L 27/088* (2013.01)

(58) Field of Classification Search
USPC ................................................. 257/401, 438
IPC ................. H01L 29/6656,21/28132, 21/31105, 21/823418, 21/823468, 21/823475, 27/088
See application file for complete search history.

(56) References Cited

U.S. PATENT DOCUMENTS

| | | | |
|---|---|---|---|
| 5,683,921 A * | 11/1997 | Nishio | H01L 29/0653 438/297 |
| 7,694,413 B2 | 4/2010 | Johnston | |
| 7,768,074 B2 | 8/2010 | Golonzka | |
| 9,349,833 B1 | 5/2016 | Hung | |

(Continued)

*Primary Examiner* — Hrayr A Sayadian
(74) *Attorney, Agent, or Firm* — Winston Hsu

(57) ABSTRACT

A semiconductor device includes a semiconductor substrate, a gate structure, a source/drain region, a source/drain contact structure, a first dielectric layer, a first spacer, and a first connection structure. The gate structure is disposed on the semiconductor substrate. The source/drain region is disposed in the semiconductor substrate and disposed at a side of the gate structure. The source/drain contact structure is disposed on the source/drain region. The first dielectric layer is disposed on the source/drain contact structure and the gate structure. The first spacer is disposed in a first contact hole penetrating the first dielectric layer on the source/drain contact structure. The first connection structure is disposed in the first contact hole. The first connection structure is surrounded by the first spacer in the first contact hole, and the first connection structure is connected with the source/drain contact structure.

18 Claims, 11 Drawing Sheets

(56) References Cited

U.S. PATENT DOCUMENTS

2010/0283152 A1 11/2010 Chen
2011/0101468 A1  5/2011 Nakajima

* cited by examiner

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a spacer surrounding a connection structure and a manufacturing method thereof.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. For example, in field effect transistors, the spacing between gate lines becomes smaller for enhancing the integrity of the integrated circuit. The process window of forming conductive plugs between gate lines and/or on the gate lines will be very small when the critical dimensions of the gate lines and the spacing between the gate lines become smaller continuously. Accordingly, misalignments occurred in the process of forming the conductive plugs may generate defects and result in yield loss.

SUMMARY OF THE INVENTION

A semiconductor device and a manufacturing method thereof are provided in the present invention. A spacer is formed in a contact hole before forming a connection structure for avoiding defects generated by the misalignment of the contact hole and the conductive material of the connection structure extending below the contact hole. The manufacturing yield may be enhanced accordingly.

According to an embodiment of the present invention, a semiconductor device is provided. The semiconductor device includes a semiconductor substrate, a gate structure, a source/drain region, a source/drain contact structure, a first dielectric layer, a first spacer, and a first connection structure. The gate structure is disposed on the semiconductor substrate. The source/drain region is disposed in the semiconductor substrate and disposed at a side of the gate structure. The source/drain contact structure is disposed on the source/drain region. The first dielectric layer is disposed on the source/drain contact structure and the gate structure. The first spacer is disposed in a first contact hole penetrating the first dielectric layer on the source/drain contact structure. The first connection structure is disposed in the first contact hole. The first connection structure is surrounded by the first spacer in the first contact hole, and the first connection structure is connected with the source/drain contact structure.

According to an embodiment of the present invention, a manufacturing method of a semiconductor device is provided. The manufacturing method includes the following steps. A semiconductor substrate is provided. A gate structure is formed on the semiconductor substrate. A source/drain region is formed in the semiconductor substrate and formed at a side of the gate structure. A source/drain contact structure is formed on the source/drain region. A first dielectric layer is formed on the source/drain contact structure and the gate structure. A first contact hole is formed penetrating the first dielectric layer on the source/drain contact structure. A first spacer is formed in the first contact hole. A first connection structure is formed in the first contact hole. The first connection structure is surrounded by the first spacer in the first contact hole, and the first connection structure is connected with the source/drain contact structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
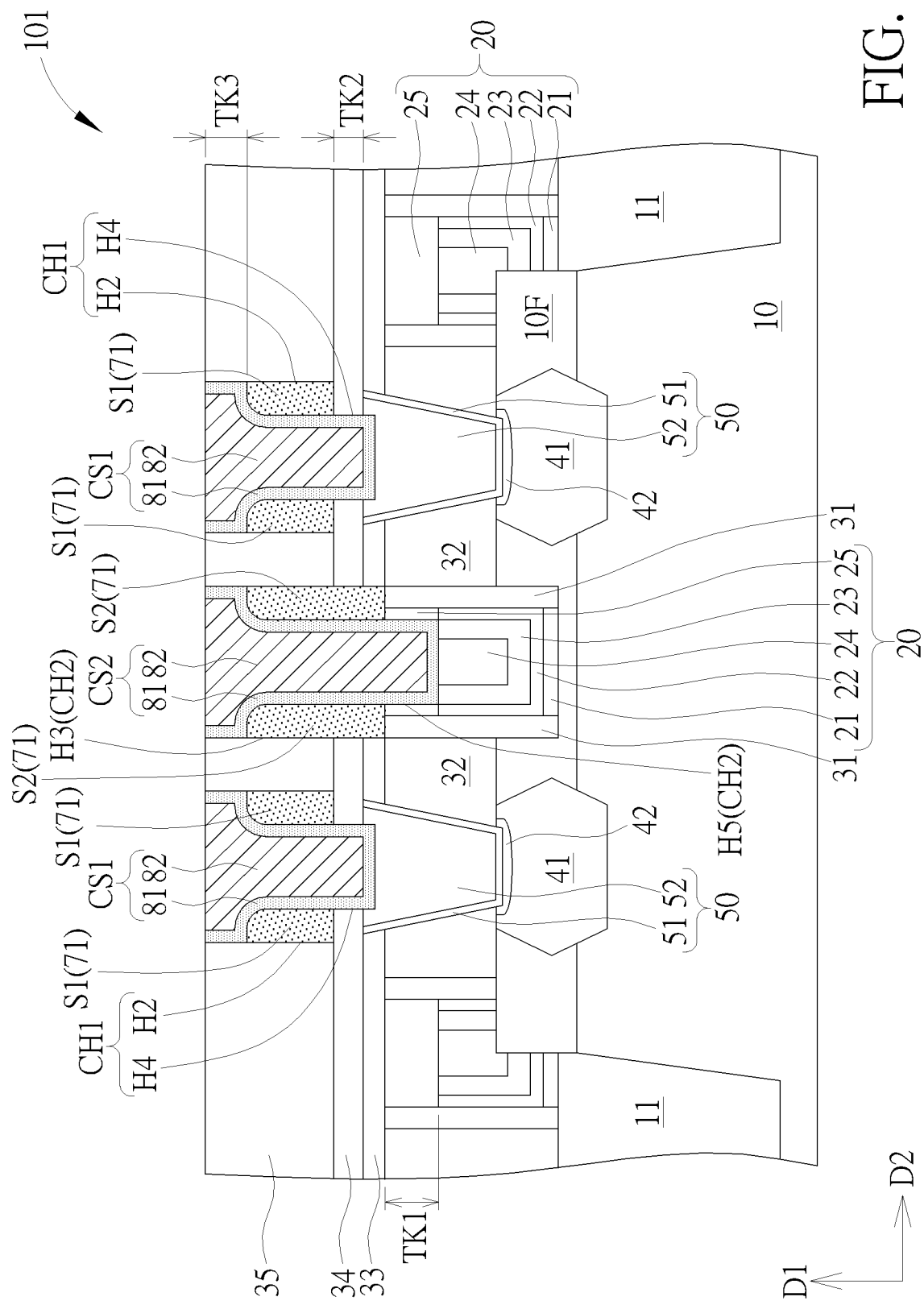
FIG. 1 is a schematic drawing illustrating a semiconductor device according to a first embodiment of the present invention.

Please refer to FIG. 1. FIG. 1 is a schematic drawing illustrating a semiconductor device according to a first embodiment of the present invention. As shown in FIG. 1, a semiconductor device 101 is provided in this embodiment. The semiconductor device 101 includes a semiconductor substrate 10, a gate structure 20, a source/drain region 41, a source/drain contact structure 50, a first dielectric layer 35, a first spacer S1, and a first connection structure CS1. The gate structure 20 is disposed on the semiconductor substrate 10. The source/drain region 41 is disposed in the semiconductor substrate 10 and disposed at a side of the gate structure 20. The source/drain contact structure 50 is disposed on the source/drain region 41. The first dielectric layer 35 is disposed on the source/drain contact structure 50 and the gate structure 20. The first spacer S1 is disposed in a first contact hole CH1 penetrating the first dielectric layer 35 on the source/drain contact structure 50. The first connection structure CS1 is disposed in the first contact hole CH1. The first connection structure CS1 is surrounded by the first spacer S1 in the first contact hole CH1, and the first connection structure CS1 is connected with the source/drain contact structure 50.

In some embodiments, the semiconductor substrate 10 may include a silicon substrate, an epitaxial silicon substrate, a silicon germanium substrate, a silicon carbide substrate, or a silicon-on-insulator (SOI) substrate, but not limited thereto. The semiconductor substrate 10 may include a fin-shaped structure 10F according to some considerations, and the gate structure 20 may be disposed on the fin-shaped structure 10F of the semiconductor substrate 10, but not limited thereto. Additionally, a shallow trench isolation 11 may be formed in the substrate 10 for isolating the fin-shaped structures 10F from one another. The shallow trench isolation 11 may be formed by a single layer or a multiple layers of insulation materials such as silicon nitride, silicon oxynitride, silicon carbonitride, or other suitable insulation materials. A plurality of the gate structures 20 may be disposed on the semiconductor substrate 10, and some of the gate structures 20 may be partly disposed on the shallow trench isolation 11 and be regarded as a dummy gate, but not limited thereto. In some embodiments, each of the gate structures 20 may include an interfacial layer 21, a gate dielectric layer 22, a work function layer 23, a gate electrode 24, and a cap layer 25, and a gate spacer 31 may be disposed on a sidewall of each of the gate structures 20, but not limited thereto. The interfacial layer 21 may include silicon oxide or other suitable dielectric materials. The gate dielectric layer 22 may include a high dielectric constant (high-k) dielectric material, such as hafnium oxide ($HfO_2$), hafnium silicon oxide ($HfSiO_4$), hafnium silicon oxynitride (Hf-SiON), aluminum oxide ($Al_2O_3$), tantalum oxide ($Ta_2O_5$), zirconium oxide ($ZrO_2$), or other suitable high-k dielectric materials. The work function layer 23 may include tantalum nitride (TaN), titanium nitride (TiN), titanium carbide (TiC), titanium aluminide (TiAl), titanium aluminum carbide (TiAlC), or other suitable N type work function materials and/or P type work function materials. The gate electrode 24 may include a low resistivity metal, such as aluminum (Al), tungsten (W), copper (Cu), titanium aluminide, or other appropriate low resistivity conductive metal materials. The cap layer 25 and the gate spacer 31 may respectively include silicon nitride, silicon carbonitride, or other suitable insulation materials, and the gate spacer 31 may be a structure composed of a single layer or a multiple layers of insulation materials.

In some embodiments, the semiconductor device 101 may further include a second dielectric layer 32 disposed between the first dielectric layer 35 and the semiconductor substrate 10 in a thickness direction of the semiconductor substrate 10 (such as a first direction D1 shown in FIG. 1). The second dielectric layer 32 may be disposed between the gate structures 20 adjacent to one another in a horizontal direction (such as a second direction D2 shown in FIG. 1), and the source/drain contact structure 50 may penetrate the second dielectric layer 32 in the first direction D1 and be electrically connected with the corresponding source/drain region 41. In some embodiments, the fin-shaped structure 10F may be elongated in the second direction D2, and the semiconductor devise 101 may include two source/drain regions 41 disposed at two opposite sides of the gate structure 20 in the second direction D2 respectively. The source/drain region 41 may include an epitaxial structure, a doped region in the fin-shaped structure 10F, or other suitable types of source/drain structures, and a silicide layer 42 may be formed between the source/drain region 41 and the source/drain contact structure 50 for reducing the contact resistance between the source/drain region 41 and the source/drain contact structure 50, but not limited thereto. Additionally, in some embodiments, the source/drain contact structure 50 may include a first barrier layer 51 and a first conductive material 52. The first barrier layer 51 may include titanium nitride, tantalum nitride, or other suitable barrier materials, and the first conductive material 52 may include materials with relatively lower resistivity, such as copper, aluminum, and tungsten, but not limited thereto. In some embodiments, the semiconductor device 101 may further include a third dielectric layer 33 disposed between the second dielectric layer 32 and the first dielectric layer 35 in the first direction D1. The third dielectric layer 33 may cover the gate structures 20 and the second dielectric layer 32, and the source/drain contact structure 50 may penetrate the third dielectric layer 33 and the second dielectric layer 32 on the corresponding source/drain region 41, but not limited thereto. The materials of the first dielectric layer 35, the second dielectric layer 32, and the third dielectric layer 33 may include silicon oxide or other suitable insulation materials.

In some embodiments, the semiconductor device 101 may further include a mask layer (such as a first mask layer 34 shown in FIG. 1) disposed between the first dielectric layer 35 and the source/drain contact structure 50. The first mask layer 34 may be disposed between the first dielectric layer 35 and the third dielectric layer 33 in the first direction D1, and the first mask layer 34 may include silicon nitride or other suitable insulation materials. In some embodiments, the first spacer S1 may be disposed on the first mask layer 34, and the first connection structure CS1 may penetrate the first mask layer 34 on the source/drain contact structure 50 for contacting and being electrically connected with the source/drain contact structure 50. The first spacer S1 may include silicon nitride, silicon oxycarbonitride (SiOCN), or other suitable insulation materials. The first connection structure CS1 may include a second barrier layer 81 and a second conductive material 82. The second barrier layer 81 may include titanium nitride, tantalum nitride, or other suitable barrier materials, and the second conductive material 82 may include materials with relatively lower resistivity, such as copper, aluminum, and tungsten, but not limited thereto.

In some embodiments, the first contact hole CH1 may be composed of a second hole H2 penetrating the first dielectric layer 35 and a fourth hole H4 penetrating the first mask layer 34, and the fourth hole H4 may be smaller than the second hole H2, but not limited thereto. The first spacer S1 may be disposed on the first mask layer 34 and the first spacer S1 is not disposed in the fourth hole H4, and the first connection structure CS1 may be disposed in the second hole H2 and the fourth hole H4. Therefore, the bottommost surface of the first spacer S1 may be higher than the bottommost surface of the first connection structure CS1 in the thickness direction of the semiconductor substrate 10 (i.e. the first direction D1). Additionally, in some embodiments, the topmost surface of the first spacer S1 may be lower than the topmost surface of the first connection structure CS1 in the first direction D1, a top portion of the first connection structure CS1 may cover the topmost surface of the first spacer S1 in the first direction D1, and the topmost surface of the first connection structure CS1 may be coplanar with the topmost surface of the first dielectric layer 35, but not limited thereto. For example, an upper width of the first connection structure CS1 may be larger than a lower width of the first connection structure CS1, and the first connection structure CS1 may have a T-shaped structure in a cross-sectional diagram of the semiconductor device 101, but not limited thereto. The first spacer S1 may surround the first connection structure CS1 in the first contact hole CH1 for avoiding defects generated by the conductive material of the first connection structure CS1 (such as the second barrier layer 81 and/or the second conductive material 82) extending below the first contact hole CH1 when the first contact hole CH1 is formed misaligned, and the manufacturing yield may be enhanced accordingly. In addition, the process window of other connection structures subsequently formed on the first connection structure CS1 may be increased because of the relatively larger top portion of the first connection structure CS1, and that will further benefit the total manufacturing yield.

As shown in FIG. 1, in some embodiments, the semiconductor device 101 may further include a second spacer S2 and a second connection structure CS2. The second spacer S2 and the second connection structure CS2 may be disposed in a second contact hole CH2 penetrating the first dielectric layer 35 on the gate electrode 20. The second connection structure CS2 may be surrounded by the second spacer S2 in the second contact hole CH2, and the second connection structure CS2 is connected with the gate structure 20. The second spacer S2 may include silicon nitride, silicon oxycarbonitride, or other suitable insulation materials. The material of the second connection structure CS2 may be identical to that of the first connection structure CS1 and may include the second barrier layer 81 and the second conductive material 82, but not limited thereto. In some embodiments, the second connection structure CS2 may also be formed by materials different from the first connection structure CS1 according to some considerations.

In some embodiments, the second contact hole CH2 may be composed of a third hole H3 penetrating the first dielectric layer 35, the first mask layer 34, and the third dielectric layer 33 and a fifth hole H5 penetrating the cap layer 25, and the fifth hole H5 is smaller than the third hole H3, but not limited thereto. The second spacer S2 may be disposed in the third hole H3 and the second spacer S2 is not disposed in the fifth hole H5, and the second connection structure CS2 may be disposed in the third hole H3 and the fifth hole H5. Therefore, the bottommost surface of the second spacer S2 may be higher than the bottommost surface of the second connection structure CS2 in the first direction D1, and the bottommost surface of the second spacer S2 may be lower than the bottommost surface of the first spacer S1 in the first direction D1. Additionally, in some embodiments, the topmost surface of the second spacer S2 may be lower than the topmost surface of the second connection structure CS2 in the first direction D1, a top portion of the second connection structure CS2 may cover the topmost surface of the second spacer S2 in the first direction D1, and the topmost surface of the second connection structure CS2 may be coplanar with the topmost surface of the first dielectric layer 35, but not limited thereto. For example, an upper width of the second connection structure CS2 may be larger than a lower width of the second connection structure CS2, and the second connection structure CS2 may have a T-shaped structure in a cross-sectional diagram of the semiconductor device 101, but not limited thereto. The second spacer S2 may surround the second connection structure CS2 in the second contact hole CH2 for avoiding defects generated by the conductive material of the second connection structure CS2 (such as the second barrier layer 81 and/or the second conductive material 82) extending below the second contact hole CH2 when the second contact hole CH2 is formed misaligned, and the manufacturing yield may be enhanced accordingly. In addition, the process window of other connection structures subsequently formed on the second connection structure CS2 may be increased because of the relatively larger top portion of the second connection structure CS2, and that will further benefit the total manufacturing yield.

Figure 2:
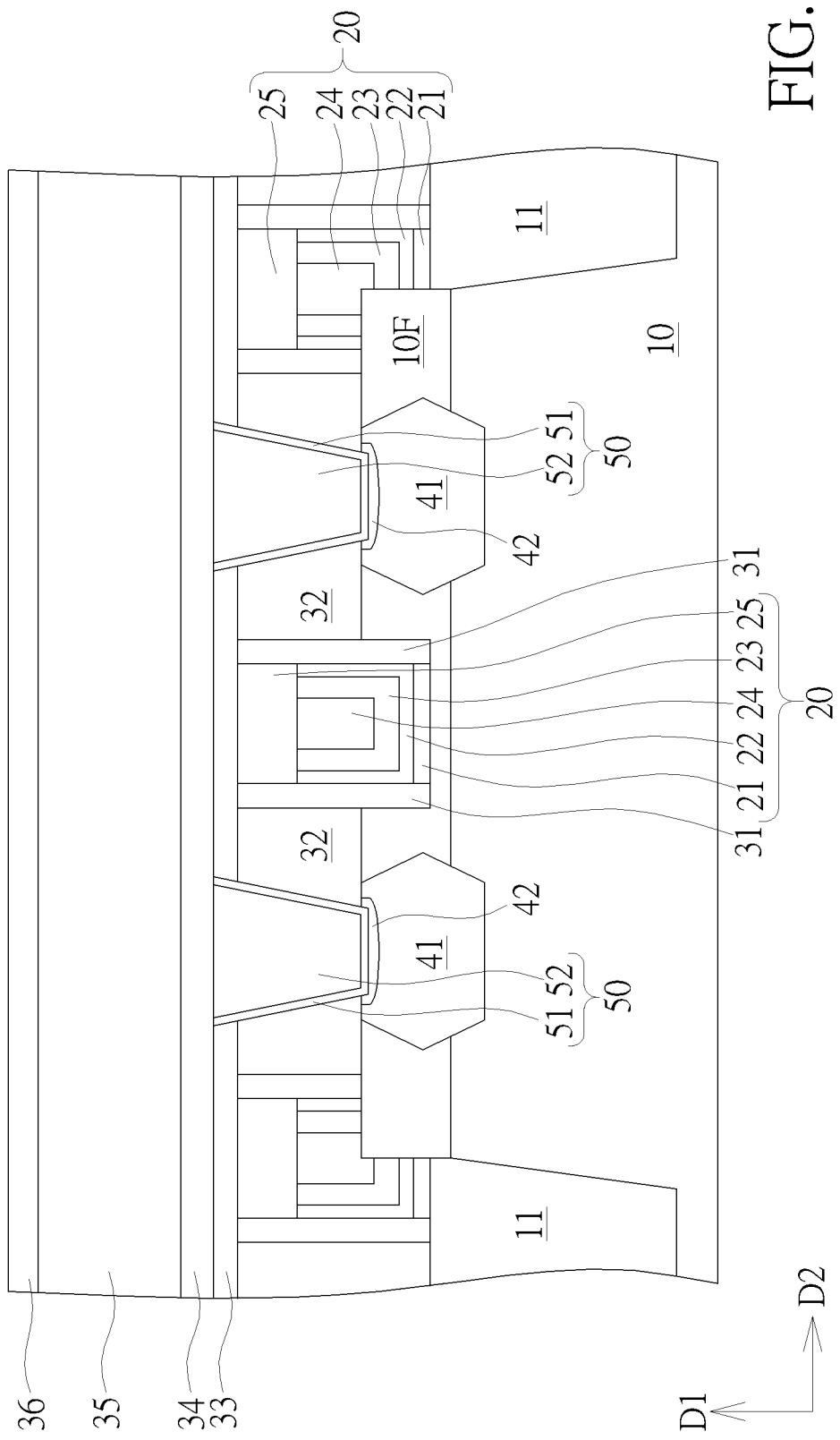
Figure 3:
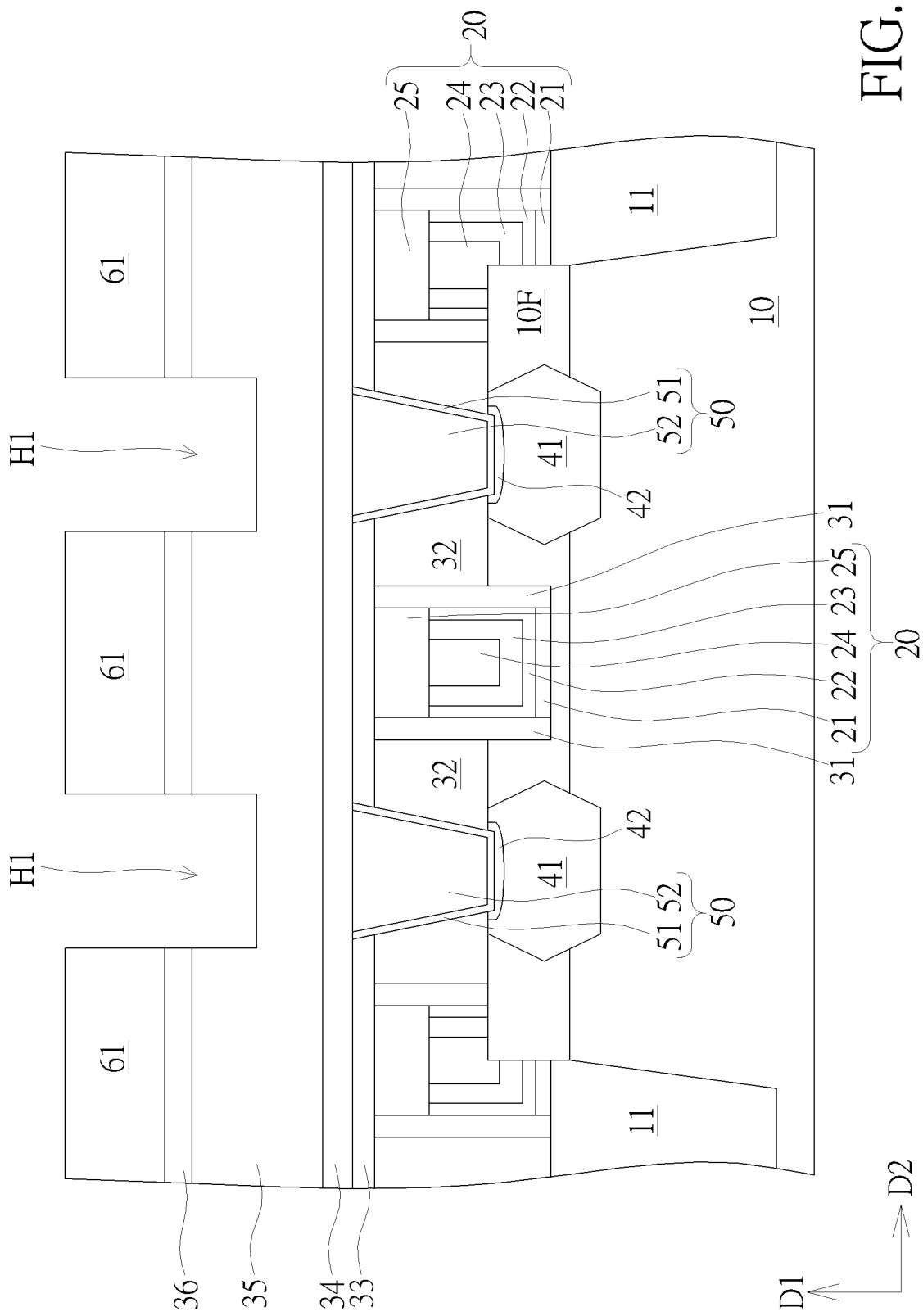
Figure 4:
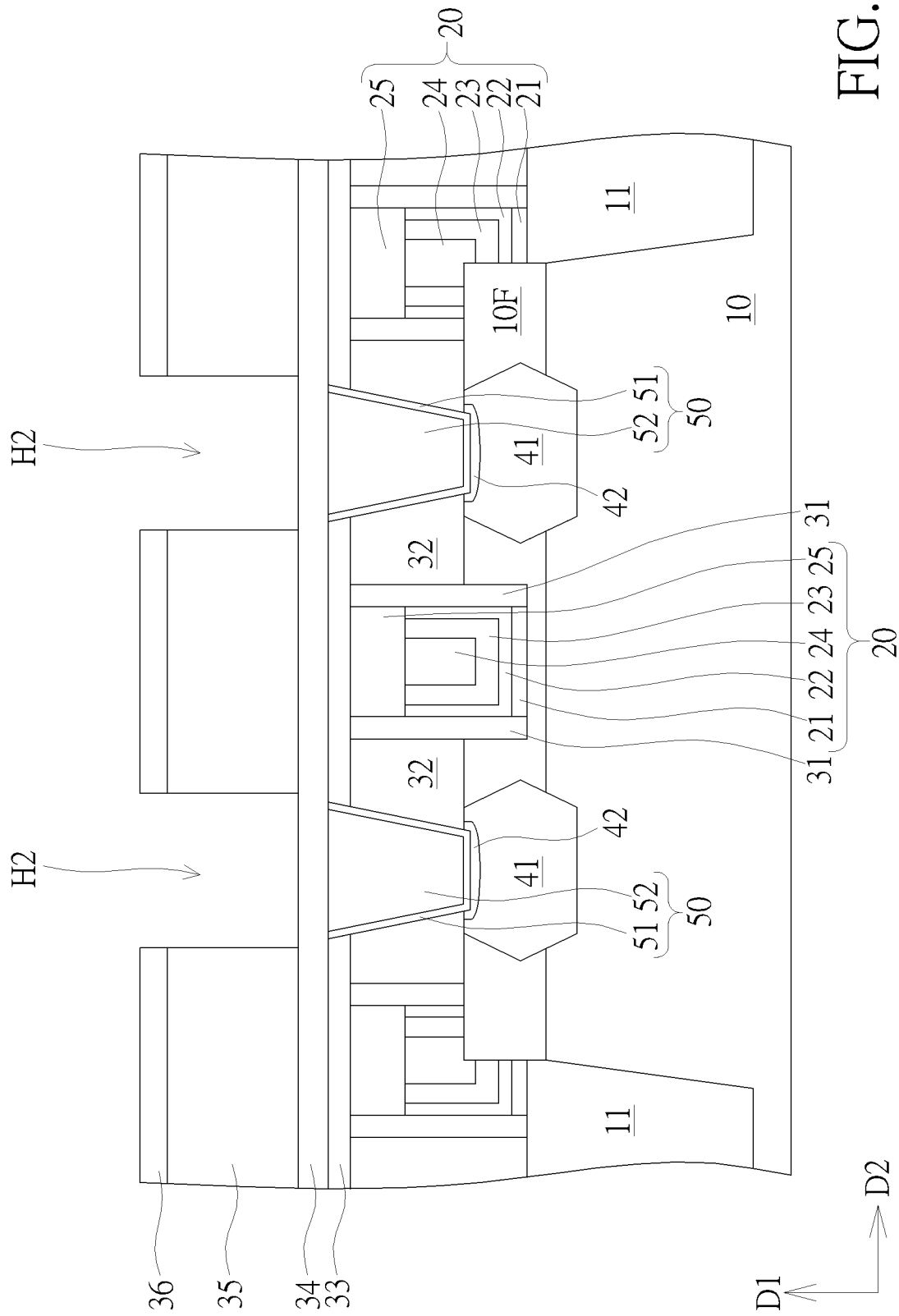
Figure 5:
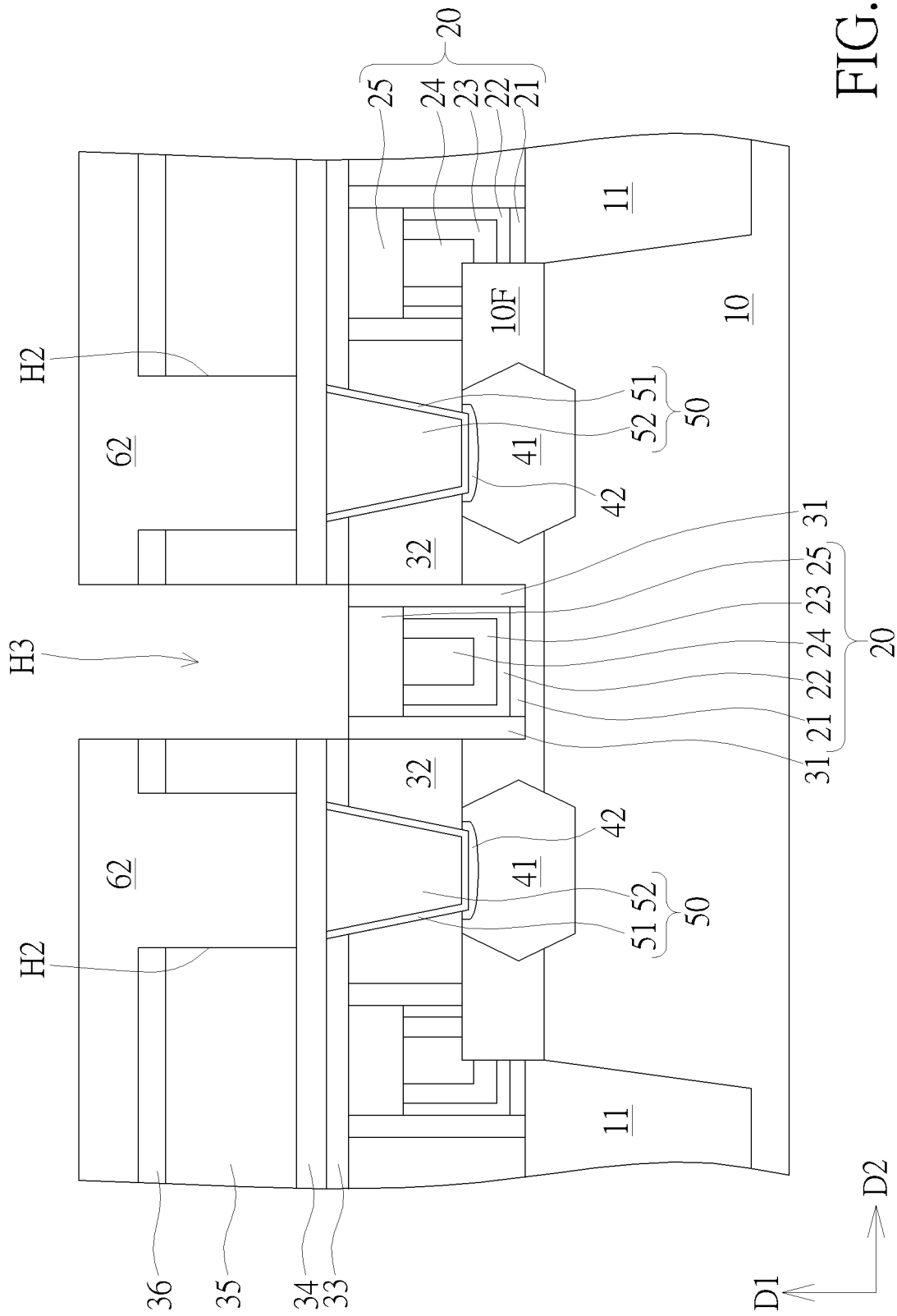
Figure 6:
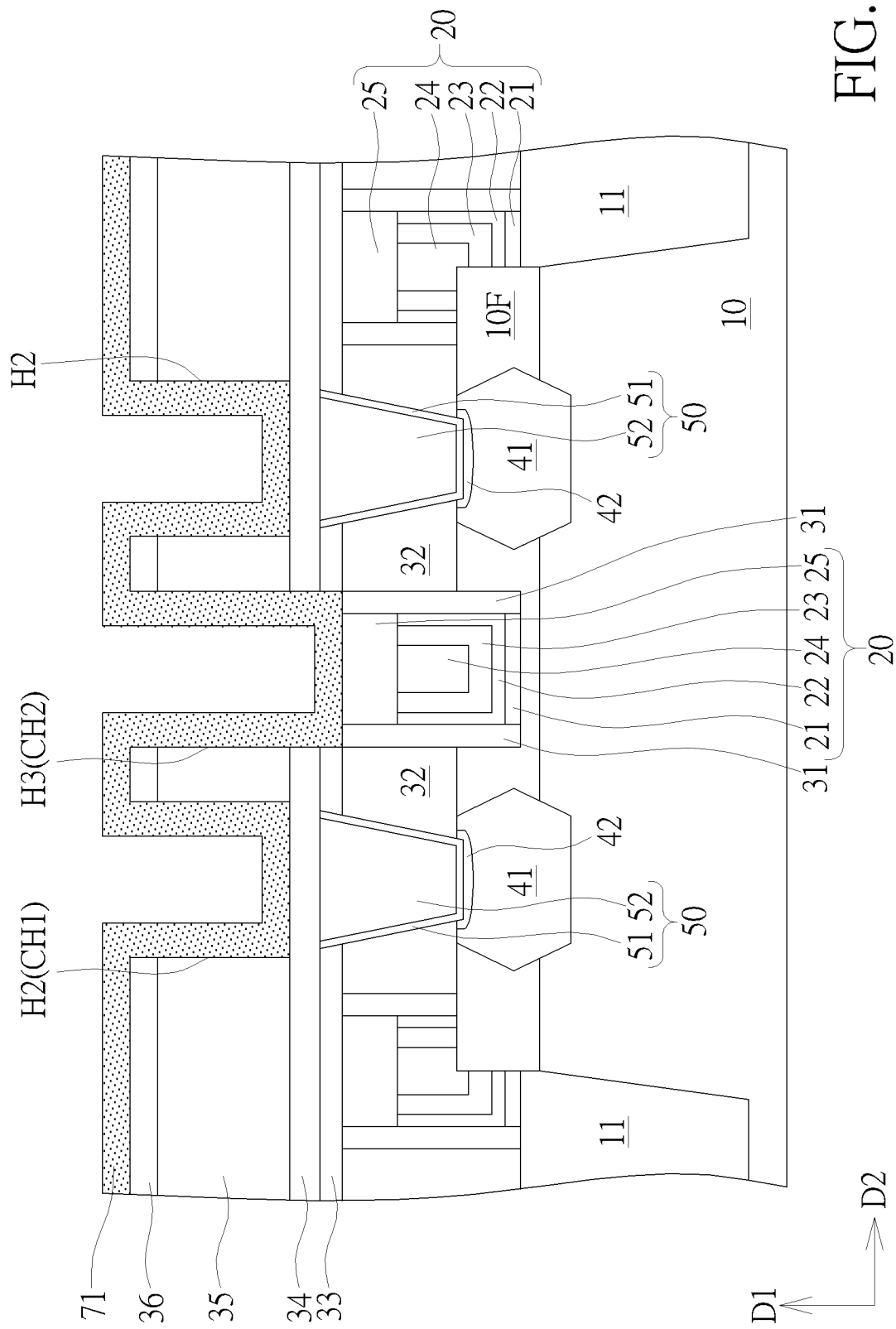
Figure 7:
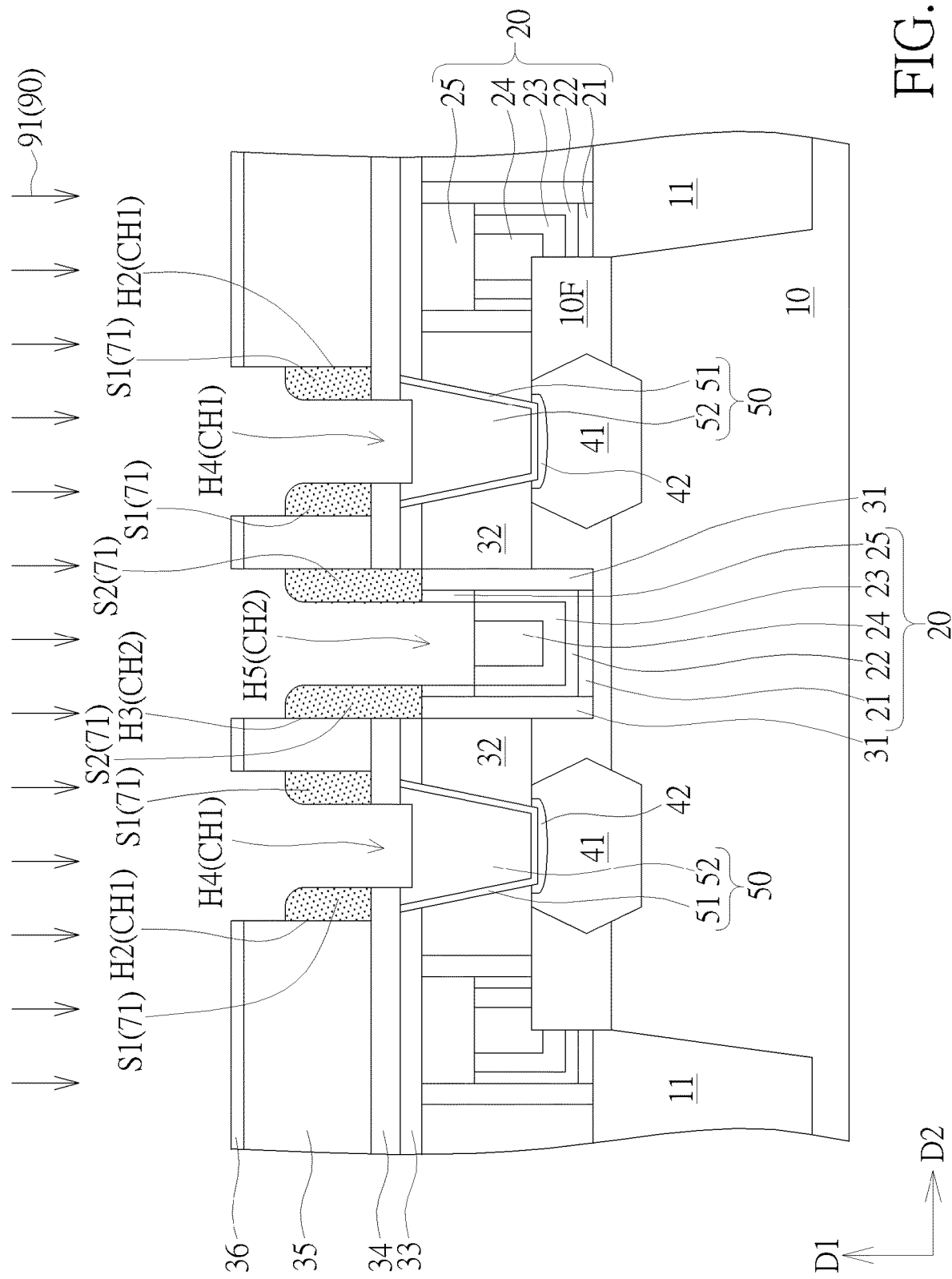
Figure 8:
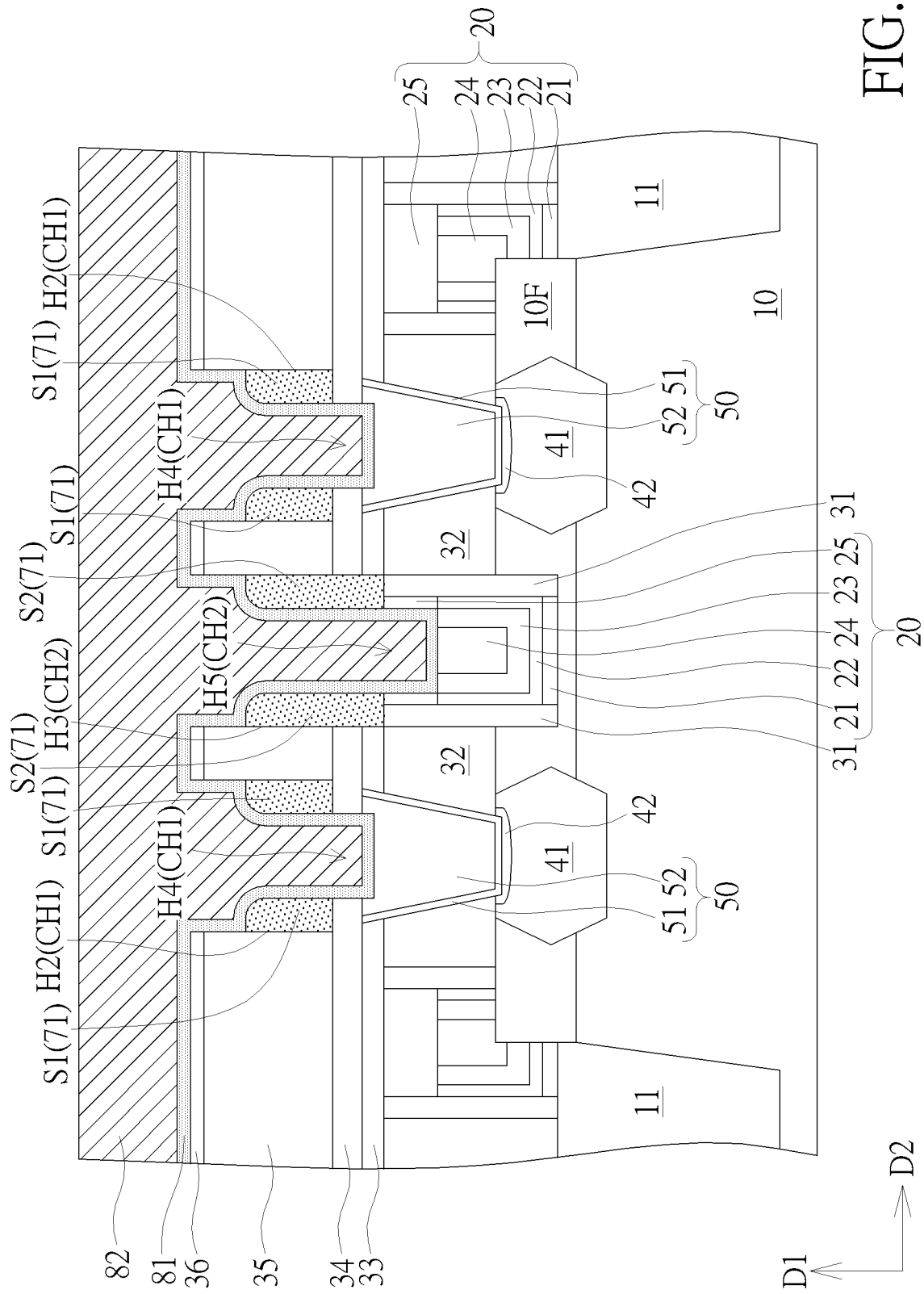

Please refer to FIGS. 1-8. FIGS. 2-8 are schematic drawings illustrating a manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 1 may be regarded as a schematic drawing in a step subsequent to FIG. 8. As shown in FIG. 1, the manufacturing method of the semiconductor device in this embodiment may include the following steps. The semiconductor substrate 10 is provided first. The gate structure 20 is formed on the semiconductor substrate 10. The source/drain region 41 is formed in the semiconductor substrate 10 and formed at a side of the gate structure 20. The source/drain contact structure 50 is formed on the source/drain region 41. The first dielectric layer 35 is formed on the source/drain contact structure 50 and the gate structure 20. The first contact hole CH1 is formed penetrating the first dielectric layer 35 on the source/drain contact structure 50. The first spacer S1 is formed in the first contact hole CH1. The first connection structure CS1 is formed in the first contact hole CH1. The first connection structure CS1 is surrounded by the first spacer S1 in the first contact hole CH1, and the first connection structure CS1 is connected with the source/drain contact structure 50.

Specifically, the manufacturing method of the semiconductor device 101 in this embodiment may include but is not limited to the following steps. As shown in FIG. 2, the second dielectric layer 32 may be formed on the semiconductor substrate 10 and be located between the gate structures 20. In some embodiments, the gate structures 20 may be formed by a replacement metal gate (RMG) process, and the gate structure 20 may be formed in a trench formed by the gate spacers 31 and the second dielectric layer 32, but not limited thereto. The third dielectric layer 33 may be formed covering the gate structure 20 and the second dielectric layer 32 after the step of forming the gate structures 20. Subsequently, the source/drain contact structure 50 is formed penetrating the third dielectric layer 33 and the second dielectric layer on the corresponding source/drain region 41 for being electrically connected with the corresponding source/drain region 41. In other words, the second dielectric layer 32 and the third dielectric layer 33 are formed before the step of forming the source/drain contact structure 50. The first mask layer 34, the first dielectric layer 35, and a second mask layer 36 are then sequentially formed. In other words, the first mask layer 34 may be formed on the source/drain contact structure 50 before the step of forming the first dielectric layer 35, the first dielectric layer 35 may be formed on the first mask layer 34, and the second mask layer 36 may be formed on the first dielectric layer 35. The second mask layer 36 may include an insulation material such as silicon nitride, metal oxide such as hafnium oxide, a metal material, or other suitable mask materials.

As shown in FIG. 3, a first patterned photoresist layer 61 is formed on the second mask layer 36. The first patterned mask layer 61 is used to pattern the second mask layer 35 and form first holes H1, and the first holes H1 do not penetrate the first dielectric layer 35. In some embodiments, the first holes H1 located corresponding to different source/drain contact structures 50 may be respectively formed by a multiple patterning process, but not limited thereto. As shown in FIG. 3 and FIG. 4, the first patterned mask layer 61 is removed, and an etching process using the patterned second mask layer 36 as a mask may be performed to the first dielectric layer 35 for forming the second holes H2. The etching process for forming the second holes H2 may be stopped on the first mask layer 34 preferably, and the second holes H2 do not penetrate the first mask layer 34. Subsequently, as shown in FIG. 5, a second patterned photoresist layer 62 is formed, and an etching process using the second photoresist layer 62 as an etching mask is performed to etch the second mask layer 36, the first dielectric layer 35, the first mask layer 34, and the third dielectric layer 33 for forming the third hole H3. The etching process for forming the third hole H3 may be stopped on the cap layer 25 of the gate structure 20 preferably, and the third hole H3 may penetrate the second mask layer 36, the first dielectric layer 35, the first mask layer 34, and the third dielectric layer 33 without penetrating the cap layer 25. In some embodiments, the third hole H3 may be a part of the second contact hole CH2, and the second contact hole CH2 may penetrate the first dielectric layer 35, the first mask layer 34, and the third dielectric layer 33 on the gate structure 20. Additionally, the second holes H2 may be covered by the second patterned photoresist layer 62 during the etching process for forming the third hole H3, and the second holes H2 are not damaged by the etching process accordingly.

As shown in FIG. 5 and FIG. 6, the second patterned photoresist layer 62 is removed after the step of forming the third hole H3, and a spacer layer 71 is conformally formed on the second mask layer 36 and formed in the second holes H2 and the third hole H3. In some embodiments, the second hole H2 may be a part of the first contact hole CH1, and the third hole H3 may be a part of the second contact hole CH2. Therefore, the spacer layer 71 may be regarded as a layer formed in the first contact hole CH1 and the second contact hole CH2, but not limited thereto. As shown in FIG. 6 and FIG. 7, an etching back process 90 is performed to the spacer layer 71 for forming the first spacer S1 in the first contact hole CH1 and the second spacer S2 in the second contact hole CH2. In other words, the first spacer S1 and the second spacer S2 may be formed concurrently by the same material and the same process, but not limited thereto. In some embodiments, the first spacer S1 and the second spacer S2 may also be formed by different materials and/or different processes respectively according to some considerations. Additionally, in some embodiments, the etching back process 90 may be used to form the fourth hole H4 penetrating the first mask layer 34 and the fifth hole H5 penetrating the cap layer 25. The fourth hole H4 may expose the corresponding source/drain contact structure 50, and the fifth hole H5 may expose the corresponding gate electrode 24. In some embodiments, the first spacer S1 and the second spacer S2 may be used to form the fourth holes H4 and the fifth hole H5 by a self-aligned approach, but not limited thereto. Therefore, the first spacer S1 may be formed on the first mask layer 34, the second spacer S2 may be formed on the cap layer 25 and/or the gate spacer 41, and the bottommost surface of the second spacer S2 may be lower than the bottommost surface of the first spacer S1 in the first direction D1. Additionally, in some embodiments, the etching back process 90 may include a pull down process 91 for etching the first spacer S1 and the second spacer S2, and the topmost surfaces of the first spacer S1 and the second spacer S2 may be lower than the topmost surface of the first dielectric layer 35 after the pull down process 91, but not limited thereto.

As shown in FIG. 7 and FIG. 8, the second barrier layer 81 and the second conductive material 82 may be formed after forming the first spacer S1, the second spacer S2, the fourth holes H4, and the fifth hole H5, and the first contact hole CH1 and the second contact hole CH2 may be filled with the second barrier layer 81 and the second conductive material 82. Subsequently, as shown in FIG. 8 and FIG. 1, a planarization process such as a chemical mechanical polishing (CMP) process and/or an etching back process may be sued to remove the second mask layer 36 and the second barrier layer 81 and the second conductive material 82 outside the first contact hole CH1 and the second contact hole CH2 for forming the first connection structure CS1 in the first contact hole CH1 and forming the second connection structure CS2 in the second contact hole CH2. In other words, the first connection structure CS1 and the second connection structure CS2 may be formed concurrently by the same materials and the same process, but not limited thereto. In some embodiments, the first connection structure CS1 and the second connection structure CS2 may also be formed by different materials and/or different processes respectively according to some considerations.

As shown in FIG. 7, FIG. 8, and FIG. 1, the spacer layer 71 may be formed before forming the first connection structure CS1 and the second connection structure CS2. Additionally, the pull down process 91 may be performed to the first spacer S1 before the step of forming the first connection structure CS1, and the topmost surface of the first spacer S1 may be lower than the topmost surface of the first connection structure CS1 in the thickness direction of the semiconductor substrate 10 (i.e. the first direction D1) after the pull down process 91. Additionally, the pull down process 91 may be performed to the second spacer S2 before the step of forming the second connection structure CS2, and the topmost surface of the second spacer S2 may be lower than the topmost surface of the second connection structure CS2 in the first direction D1 after the pull down process 91. In some embodiments, the pull down process 91 may be performed to the first spacer S1 and the second spacer S2 concurrently before the step of forming the first connection structure CS1 and the step of forming the second connection structure CS2, but not limited thereto. In some embodiments, different pull down processes may be performed to the first spacer S1 and the second spacer S2 respectively. Additionally, in some embodiments, the material of the cap layer 25 of the gate structure 20 may be identical to the material of the first mask layer 34, and the thickness of the cap layer 25 (such as a first thickness TK1 shown in FIG. 1) may be substantially equal to the thickness of the first mask layer 34 (such as a second thickness TK2 shown in FIG. 1) for controlling the depth of the fourth hole H4 and the depth of the fifth hole H5 formed by the etching back process 90. Additionally, in some embodiments, the thickness of the part of the first connection structure CS1 formed on the first spacer S1 (such as a third thickness TK3 shown in FIG. 1) may be substantially equal to the second thickness TK2 of the first mask layer 34 when the material of the spacer layer 71 is similar to the material of the first mask layer 34 and/or the etching rate of the spacer layer 71 in the etching back process 90 is substantially equal to the etching rate of the first mask layer 34 in the etching back process 90, but not limited thereto The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
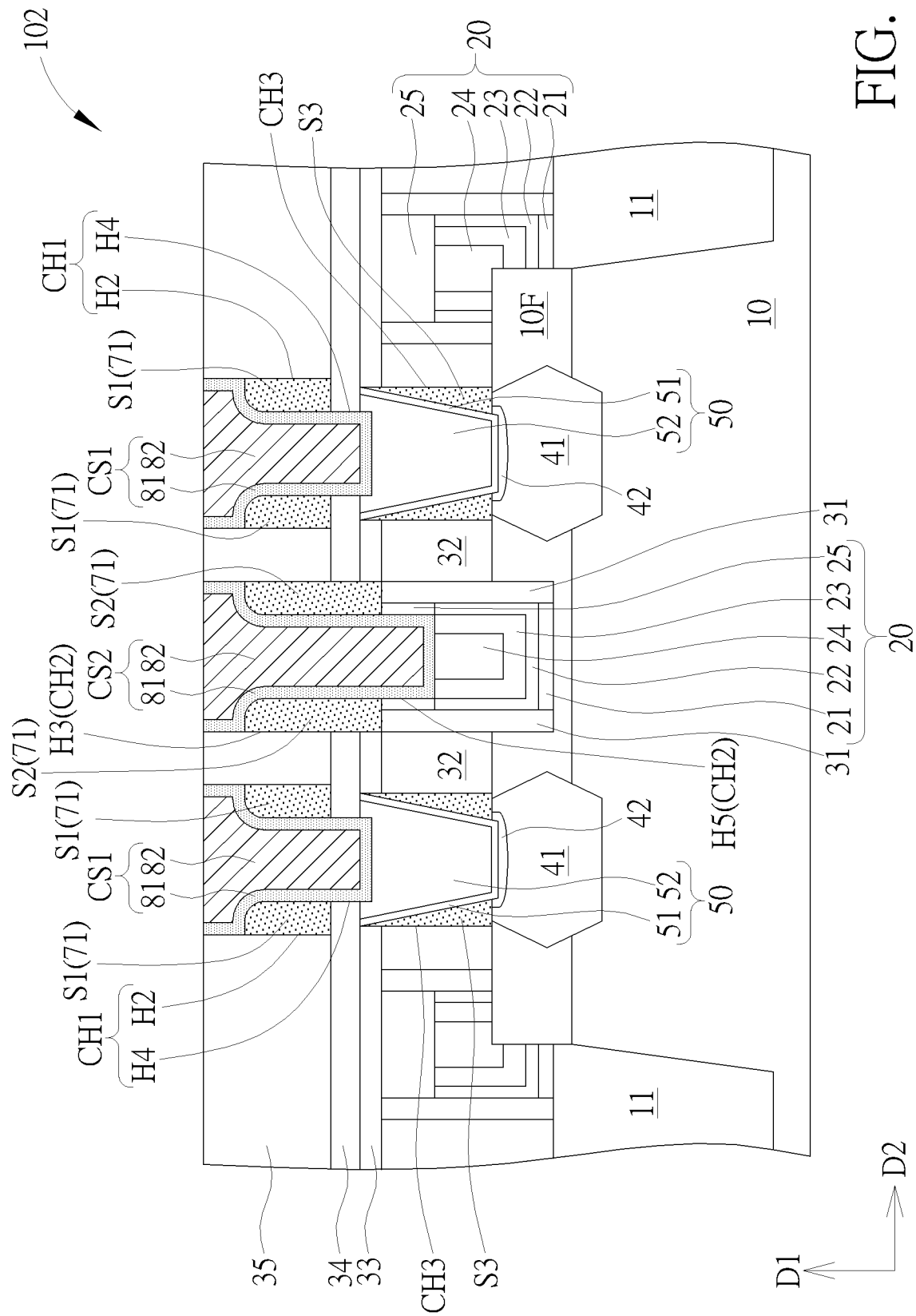
FIG. 9 is a schematic drawing illustrating a semiconductor device according to a second embodiment of the present invention.

Please refer to FIG. 9. FIG. 9 is a schematic drawing illustrating a semiconductor device 102 according to a second embodiment of the present invention. As shown in FIG. 9, the difference between the semiconductor device 102 and the semiconductor device of the first embodiment described above is that the semiconductor device 102 in this embodiment may further include a third contact hole CH3 and a third spacer S3. The third spacer S3 may include silicon nitride, silicon oxycarbonitride, or other suitable insulation materials. The third contact hole CH3 penetrates the second dielectric layer 32 and the third dielectric layer 33 located on the source/drain region 41, and the third spacer S3 and the source/drain contact structure 50 are disposed in the third contact hole CH3. The source/drain contact structure 50 is surrounded by the third spacer S3 in the third contact hole CH3. In other words, the manufacturing method of the semiconductor device 102 in this embodiment may further include forming the third contact hole CH3 penetrating the third dielectric layer 33 and the second dielectric layer 32, and the third spacer S3 and the source/drain contact structure 50 are formed in the third contact hole CH3. The third spacer S2 may surround the source/drain contact structure 50 in the third contact hole CH3 for avoiding defects generated by the conductive material of the source/drain contact structure 50 (such as the first barrier layer 51 and/or the first conductive material 52) extending below the third contact hole CH3 when the third contact hole CH3 is formed misaligned, and the manufacturing yield may be further enhanced accordingly.

Figure 10:
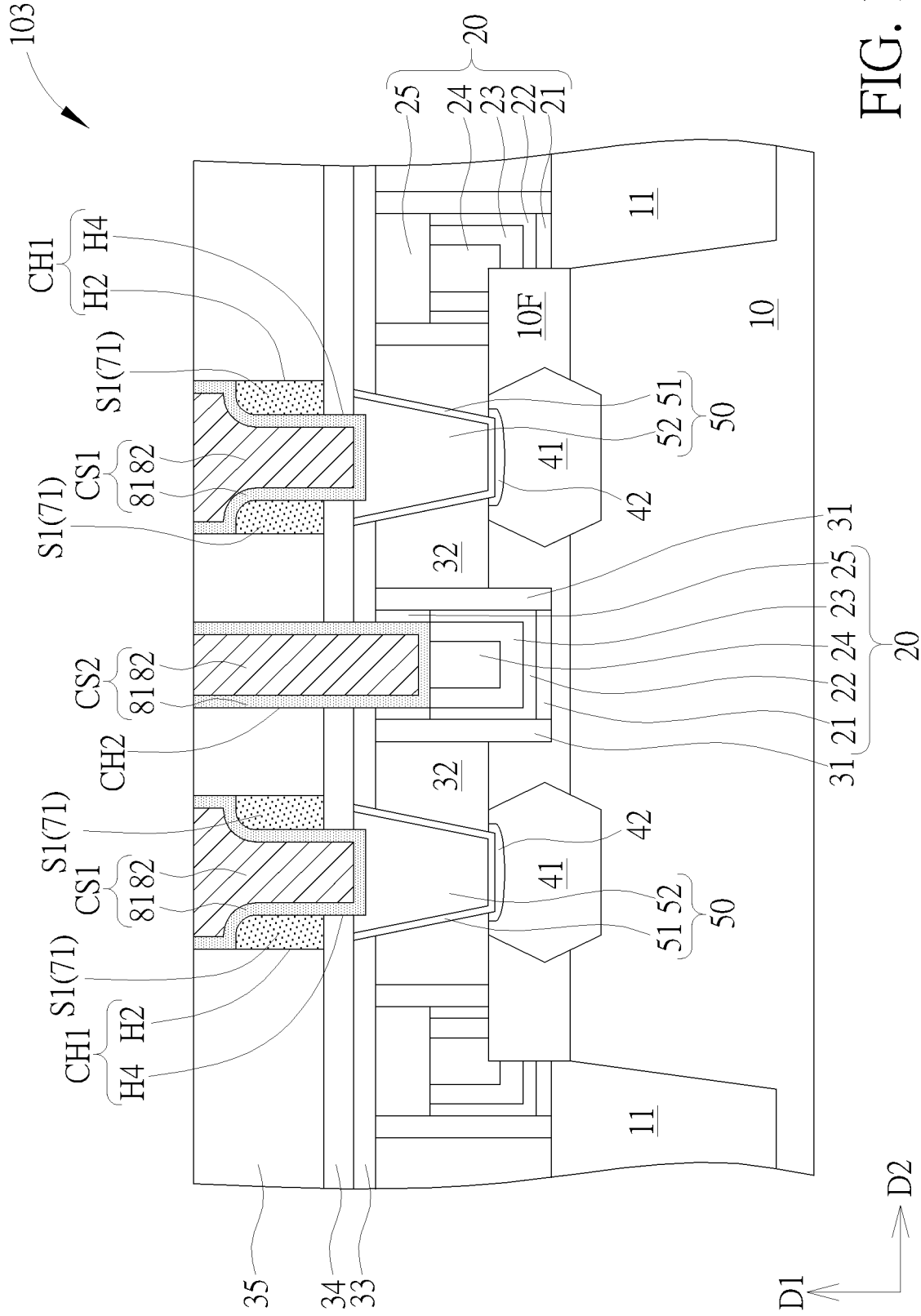
FIG. 10 is a schematic drawing illustrating a semiconductor device according to a third embodiment of the present invention.

Please refer to FIG. 10. FIG. 10 is a schematic drawing illustrating a semiconductor device 103 according to a third embodiment of the present invention. As shown in FIG. 10, the difference between the semiconductor device 103 and the semiconductor device of the first embodiment described above is that the semiconductor device 103 may not include the second spacer of the first embodiment described above, and the second connection structure CS2 in this embodiment may not have a cross-sectional shape including a wider upper part and a narrower lower part.

Figure 11:
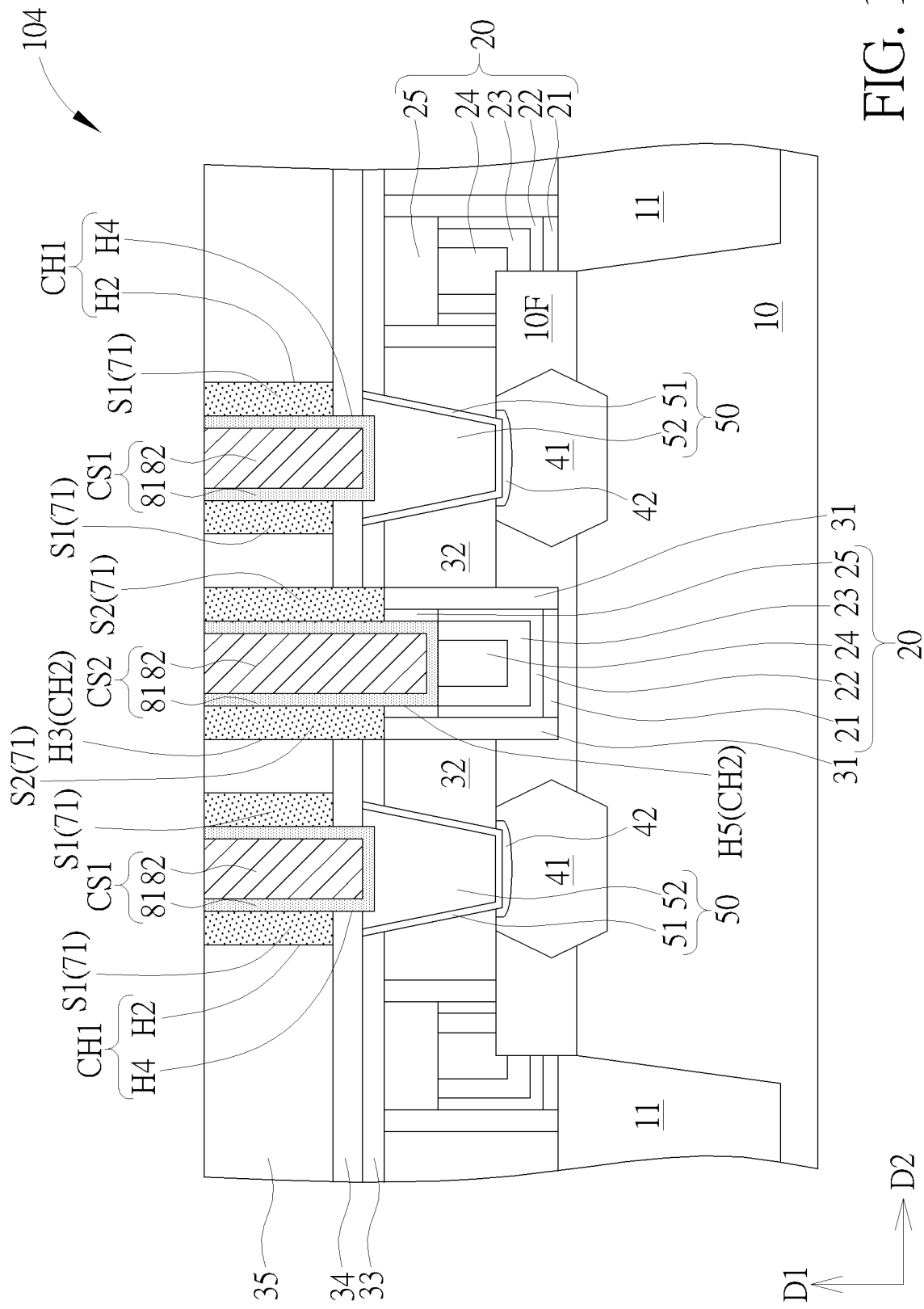
FIG. 11 is a schematic drawing illustrating a semiconductor device according to a fourth embodiment of the present invention.

Please refer to FIG. 11. FIG. 11 is a schematic drawing illustrating a semiconductor device 104 according to a fourth embodiment of the present invention. As shown in FIG. 11, the difference between the semiconductor device 103 and the semiconductor device of the first embodiment described above is that, in the manufacturing method of the semiconductor device 104 in this embodiment, there is not any pull down process performed to the first spacer S1 and the second spacer S2. Therefore, the topmost surface of the first spacer S1 and the topmost surface of the first connection structure CS1 may be substantially coplanar, and the topmost surface of the second spacer S2 and the topmost surface of the second connection structure CS2 may be substantially coplanar, but not limited thereto.

To summarize the above descriptions, according to the semiconductor device and the manufacturing method thereof in the present invention, the spacer may be formed in the contact hole before forming the connection structure in the contact hole for avoiding defects generated by the conductive material of the connection structure extending below the contact hole when the contact hole is formed misaligned, and the manufacturing yield may be enhanced accordingly. Additionally, the pull down process may be performed to the spacer in the contact hole before forming the connection structure for forming the connection structure having a relatively larger top portion, and the process window of other interconnection structures subsequently formed on the connection structure may be increased accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a semiconductor substrate;
    a gate structure disposed on the semiconductor substrate;
    a source/drain region disposed in the semiconductor substrate and disposed at a side of the gate structure;
    a source/drain contact structure disposed on the source/drain region;
    a first dielectric layer, wherein the first dielectric layer comprises a first portion and a second portion, the first portion of the first dielectric layer is disposed on the source/drain contact structure, and the second portion of the first dielectric layer is disposed on the gate structure;
    a first contact hole penetrating the first portion of the first dielectric layer on the source/drain contact structure;
    a first spacer disposed in the first contact hole;
    a first connection structure disposed in the first contact hole, wherein the first connection structure is surrounded by the first spacer in the first contact hole, and the first connection structure is connected with the source/drain contact structure; and
    a mask layer disposed between the first dielectric layer and the source/drain contact structure, wherein the first spacer is disposed on the mask layer, and the first connection structure penetrates the mask layer on the source/drain contact structure.

2. The semiconductor device according to claim 1, wherein a topmost surface of the first spacer is lower than a topmost surface of the first connection structure in a thickness direction of the semiconductor substrate.

3. The semiconductor device according to claim 2, wherein the topmost surface of the first connection structure and a topmost surface of the first dielectric layer are coplanar.

4. The semiconductor device according to claim 1, further comprising:
    a second contact hole penetrating the second portion of the first dielectric layer on the gate structure;
    a second spacer disposed in the second contact hole; and
    a second connection structure disposed in the second contact hole, wherein the second connection structure is surrounded by the second spacer in the second contact hole, and the second connection structure is connected with the gate structure.

5. The semiconductor device according to claim 4, wherein a bottommost surface of the second spacer is higher than a bottommost surface of the second connection structure in a thickness direction of the semiconductor substrate.

6. The semiconductor device according to claim 4, wherein a topmost surface of the second spacer is lower than a topmost surface of the second connection structure in a thickness direction of the semiconductor substrate.

7. The semiconductor device according to claim 6, wherein the topmost surface of the second connection structure and a topmost surface of the first dielectric layer are coplanar.

8. The semiconductor device according to claim 4, wherein a bottommost surface of the second spacer is lower than a bottommost surface of the first spacer in a thickness direction of the semiconductor substrate.

9. The semiconductor device according to claim 1, further comprising:
  a second dielectric layer disposed between the first dielectric layer and the semiconductor substrate, wherein the source/drain contact structure is disposed in a third contact hole penetrating the second dielectric layer; and
  a third spacer disposed in the third contact hole, wherein the source/drain contact structure is surrounded by the third spacer in the third contact hole.

10. A manufacturing method of a semiconductor device, comprising:
  providing a semiconductor substrate;
  forming a gate structure on the semiconductor substrate;
  forming a source/drain region in the semiconductor substrate and at a side of the gate structure;
  forming a source/drain contact structure on the source/drain region;
  forming a first dielectric layer, wherein the first dielectric layer comprises a first portion and a second portion, the first portion of the first dielectric layer is formed on the source/drain contact structure, and the second portion of the first dielectric layer is formed on the gate structure;
  forming a first contact hole penetrating the first portion of the first dielectric layer on the source/drain contact structure;
  forming a first spacer in the first contact hole; and
  forming a first connection structure in the first contact hole, wherein the first connection structure is surrounded by the first spacer in the first contact hole, and the first connection structure is connected with the source/drain contact structure; and
  forming a mask layer on the source/drain contact structure before the step of forming the first dielectric layer, wherein the first spacer is formed on the mask layer, and the first connection structure penetrates the mask layer on the source/drain contact structure.

11. The manufacturing method of the semiconductor device according to claim 10, further comprising:
  performing a pull down process to the first spacer before the step of forming the first connection structure, wherein a topmost surface of the first spacer is lower than a topmost surface of the first connection structure in a thickness direction of the semiconductor substrate.

12. The manufacturing method of the semiconductor device according to claim 10, further comprising:
  forming a second contact hole penetrating the second portion of the first dielectric layer on the gate structure;
  forming a second spacer in the second contact hole; and
  forming a second connection structure in the second contact hole, wherein the second connection structure is surrounded by the second spacer in the second contact hole, and the second connection structure is connected with the gate structure.

13. The manufacturing method of the semiconductor device according to claim 12, wherein a bottommost surface of the second spacer is higher than a bottommost surface of the second connection structure in a thickness direction of the semiconductor substrate.

14. The manufacturing method of the semiconductor device according to claim 12, further comprising:
  performing a pull down process to the second spacer before the step of forming the second connection structure, wherein a topmost surface of the second spacer is lower than a topmost surface of the second connection structure in a thickness direction of the semiconductor substrate.

15. The manufacturing method of the semiconductor device according to claim 12, wherein the steps of forming the first spacer and the second spacer comprise:
  forming a spacer layer in the first contact hole and the second contact hole before the step of forming the first connection structure and the step of forming the second connection structure; and
  performing an etching back process to the spacer layer for forming the first spacer in the first contact hole and the second spacer in the second contact hole.

16. The manufacturing method of the semiconductor device according to claim 15, further comprising:
  performing a pull down process to the first spacer and the second spacer before the step of forming the first connection structure and the step of forming the second connection structure.

17. The manufacturing method of the semiconductor device according to claim 12, wherein a bottommost surface of the second spacer is lower than a bottommost surface of the first spacer in a thickness direction of the semiconductor substrate.

18. The manufacturing method of the semiconductor device according to claim 10, further comprising:
  forming a second dielectric layer on the semiconductor substrate before the step of forming the source/drain contact structure;
  forming a third contact hole penetrating the second dielectric layer, wherein the source/drain contact structure is formed in the third contact hole; and
  forming a third spacer in the third contact hole, wherein the source/drain contact structure is surrounded by the third spacer in the third contact hole.

* * * * *